US006173490B1

(12) United States Patent
Lee et al.

(10) Patent No.: US 6,173,490 B1
(45) Date of Patent: Jan. 16, 2001

(54) METHOD FOR FORMING A PANEL OF PACKAGED INTEGRATED CIRCUITS

(75) Inventors: Shaw Wei Lee, Cupertino; Hem P. Takiar, Fremont; Fred Drummond, San Jose, all of CA (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 08/915,352

(22) Filed: Aug. 20, 1997

(51) Int. Cl.⁷ .................................................. H05K 3/30
(52) U.S. Cl. ......................... 29/841; 29/848; 264/272.14; 264/272.15; 264/272.17; 264/154; 425/120; 425/130; 425/544
(58) Field of Search ............................. 29/841, 848, 849, 29/855, 856; 264/272.14–272.15, 272.17, 157, 154, 254; 425/544, 130, 120

(56) References Cited

U.S. PATENT DOCUMENTS

| | | | |
|---|---|---|---|
| 2,577,584 | * 12/1951 | Hofreiter | 18/36 |
| 3,716,764 | * 2/1973 | Birchler et al. | 317/234 |
| 4,045,867 | * 9/1977 | Strom | 29/628 |
| 4,067,951 | * 1/1978 | Fleming et al. | 264/272 |
| 4,126,292 | * 11/1978 | Saeki et al. | 249/110 |
| 4,569,814 | * 2/1986 | Chong et al. | 264/279 |
| 4,689,103 | * 8/1987 | Elarde | 156/242 |
| 4,900,501 | * 2/1990 | Saeki et al. | 264/272.17 |
| 4,946,633 | * 8/1990 | Saeki et al. | 264/40.1 |
| 4,979,289 | * 12/1990 | Dunaway et al. | 29/834 |
| 5,052,907 | * 10/1991 | Matumoto et al. | 425/116 |
| 5,071,612 | * 12/1991 | Obara | 264/161 |
| 5,175,007 | * 12/1992 | Elliott | 425/129.1 |
| 5,239,198 | * 8/1993 | Lin et al. | 257/693 |
| 5,468,999 | * 11/1995 | Lin et al. | 257/784 |
| 5,474,958 | * 12/1995 | Djennas et al. | 437/211 |
| 5,542,171 | * 8/1996 | Juskey et al. | 29/840 |
| 5,556,647 | * 9/1996 | Abe et al. | 425/127 |
| 5,578,261 | * 11/1996 | Manzione et al. | 264/272.15 |
| 5,624,691 | * 4/1997 | Bednarz et al. | 425/116 |
| 5,674,785 | * 10/1997 | Akram et al. | 437/217 |
| 5,682,673 | * 11/1997 | Fehr | 29/827 |
| 5,741,530 | * 4/1998 | Tsunoda | 425/116 |
| 5,744,083 | * 4/1998 | Bednarz et al. | 264/272.14 |
| 5,744,084 | * 4/1998 | Chia et al. | 264/276 |
| 5,804,467 | * 9/1998 | Kawahara et al. | 438/112 |

FOREIGN PATENT DOCUMENTS

| | | | |
|---|---|---|---|
| 1164120 | * 3/1964 | (DE) | 264/272.14 |
| 1194452 | * 6/1970 | (GB) | 29/841 |
| 56-19741 | * 2/1981 | (JP) | 264/272.17 |
| 59-7009 | * 1/1984 | (JP) | 264/272.17 |
| 59-81125 | * 5/1984 | (JP) | 264/272.17 |
| 61-115330 | * 6/1986 | (JP) | 264/272.17 |
| 2-205042 | * 2/1989 | (JP) | 264/272.17 |
| 2-276257 | * 11 1990 | (JP) | 29/841 |

* cited by examiner

Primary Examiner—Carl J. Arbes
(74) Attorney, Agent, or Firm—Beyer Weaver & Thomas, LLP

(57) ABSTRACT

A method and an apparatus for forming a panel of packaged integrated circuits is disclosed. A substrate panel having an array of integrated circuits mounted thereon is placed in a mold having a molding chamber. The molding chamber has a multiplicity of adjacent package recesses flowably interconnected by way of a plurality of molding compound flowgates. Each package recess is suitable for receiving at least one associated integrated circuits. A molding compound is passed into the molding chamber by way of a mold gate such that at least some of the molding compound passes through a plurality of different package recesses by way of their associated flowgates. In one embodiment, the mold includes a mold body having a molding chamber with a plurality of ridges that define the multiplicity of package recesses within the molding chamber. The multiplicity of package recesses are flowably interconnected through flowgates formed by the ridges.

21 Claims, 7 Drawing Sheets

METHOD FOR FORMING A PANEL OF PACKAGED INTEGRATED CIRCUITS

FIELD OF THE INVENTION

The present invention relates generally to improved methods and devices for applying protective packaging to integrated circuits. More particularly, panel based encapsulation wherein a plurality of distinct integrated circuits packages are encapsulated within a single molding chamber is described.

BACKGROUND OF THE INVENTION

Semiconductor based integrated circuits dies are created from a silicon wafer through the employment of various etching, doping, and depositing steps that are well known in the art. Ultimately, the integrated circuit may be packaged by forming an encapsulant around the integrated circuit so as to form a packaged integrated circuit having a variety of pinouts or mounting and interconnection schemes. Plastic is often utilized as an encapsulant. Integrated circuit packages that utilize plastic as an encapsulant are generally less expensive then other packaging options.

Recently, efforts to improve packaging efficiency has resulted in the use of substrate panels during the packaging process. By way of example, substrate panels are commonly used in grid array and chip scale type packages. FIG. 1A is an illustration of a portion of a panel of integrated circuits 100 including a plurality of integrated circuits 102 mounted to a substrate panel 101. The substrate 101 typically provides both mechanical support for the integrated circuits 102 during the encapsulation procedure as well as electrically conductive paths between each of the plurality of integrated circuits 102 and external circuitry (not shown).

One typical arrangement for encapsulating panel based integrated circuits utilizes a conventional mold 150 as shown in FIG. 1B. The conventional mold may be used to encapsulate a plurality of groups of integrated circuits 102, 103 substantially simultaneously. As shown, a pot 120 feeds molding compound 116 contained within pot 120 to each of a pair of encapsulation regions of 122 and 124 by way of runners exemplified by runners 130 and 140. The portions of substrates 100 and 101 that are needed to facilitate routing of the runners are often effectively wasted, which is a significant concern since the substrate material can be very expensive.

Another typical arrangement for encapsulating panel based integrated circuits utilizes a gang pot mold 155 as shown in FIG. 1C. In this embodiment, molding compound 170 is fed into one or more uniform reservoirs 180 each containing a plurality of integrated circuits 190 mounted upon a substrate panel 192 as well as uniform reservoirs 182 each containing a plurality of integrated circuits 188 mounted upon a substrate 194. Unfortunately, the uniform molding of a plurality of distinct integrated circuits may cause significant warpage of the substrate panel which has an adverse effect on the singulation process. This warpage is due to the stresses induced by the setting molding compound since there is no effective stress relief afforded by the substantially uniform cross sectional area of molding compound 170 covering integrated circuits. Additionally, the uniform molding obscures the locations of each of the plurality of integrated circuits which makes subsequent singulation difficult and time consuming.

In view of the foregoing, it would be desirable to provide more efficient arrangements for encapsulating panels of integrated circuits.

SUMMARY OF THE INVENTION

To achieve the foregoing and other objects and in accordance with the purpose of the present invention, a method and an apparatus for forming a panel of packaged integrated circuits is disclosed. In one embodiment, a substrate panel having an array of integrated circuits mounted thereon is placed in a mold having a molding chamber. The molding chamber has a multiplicity of adjacent package recesses flowably interconnected by way of a plurality of molding compound flowgates. Each package recess is suitable for receiving at least one associated integrated circuit. A molding compound is passed into the molding chamber by way of a mold gate such that at least some of the molding compound passes through a plurality of different package recesses by way of their associated flowgates. After the molding is complete, the packaged integrated circuits may be singulated by any suitable method such as by a sawing or a breaking operation.

In another aspect of the present invention, a mold for forming a panel of packaged integrated circuits is described. The mold includes a mold body having a molding chamber with a plurality of ridges that define a multiplicity of package recesses within the molding chamber. The multiplicity of package recesses are flowably interconnected through flowgates formed by the ridges. The mold further includes a mold gate suitable for passing a molding compound into the molding chamber and a gas vent coupled to the molding chamber to allow gases to escape from the molding chamber during a molding operation.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
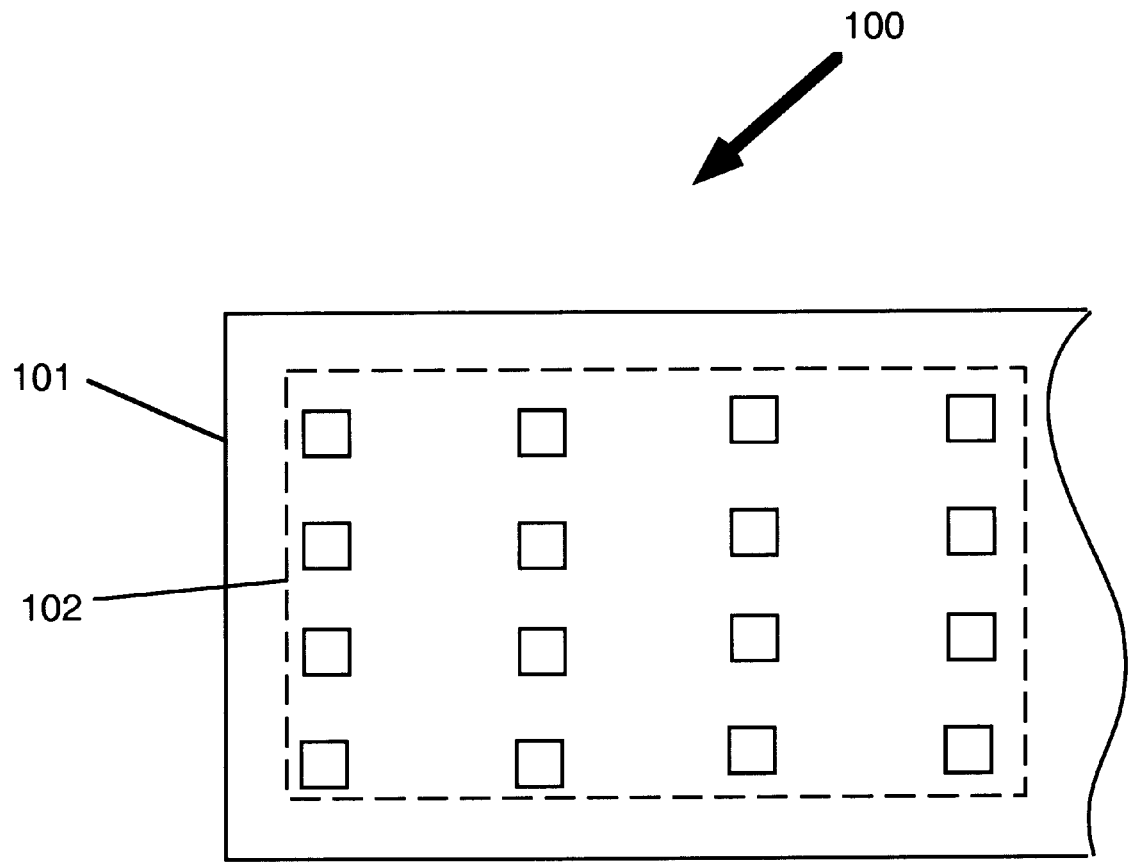
FIG. 1A is an illustration of a portion of a panel of integrated circuits including a plurality of integrated circuits mounted to a substrate panel.
Figure 1B:
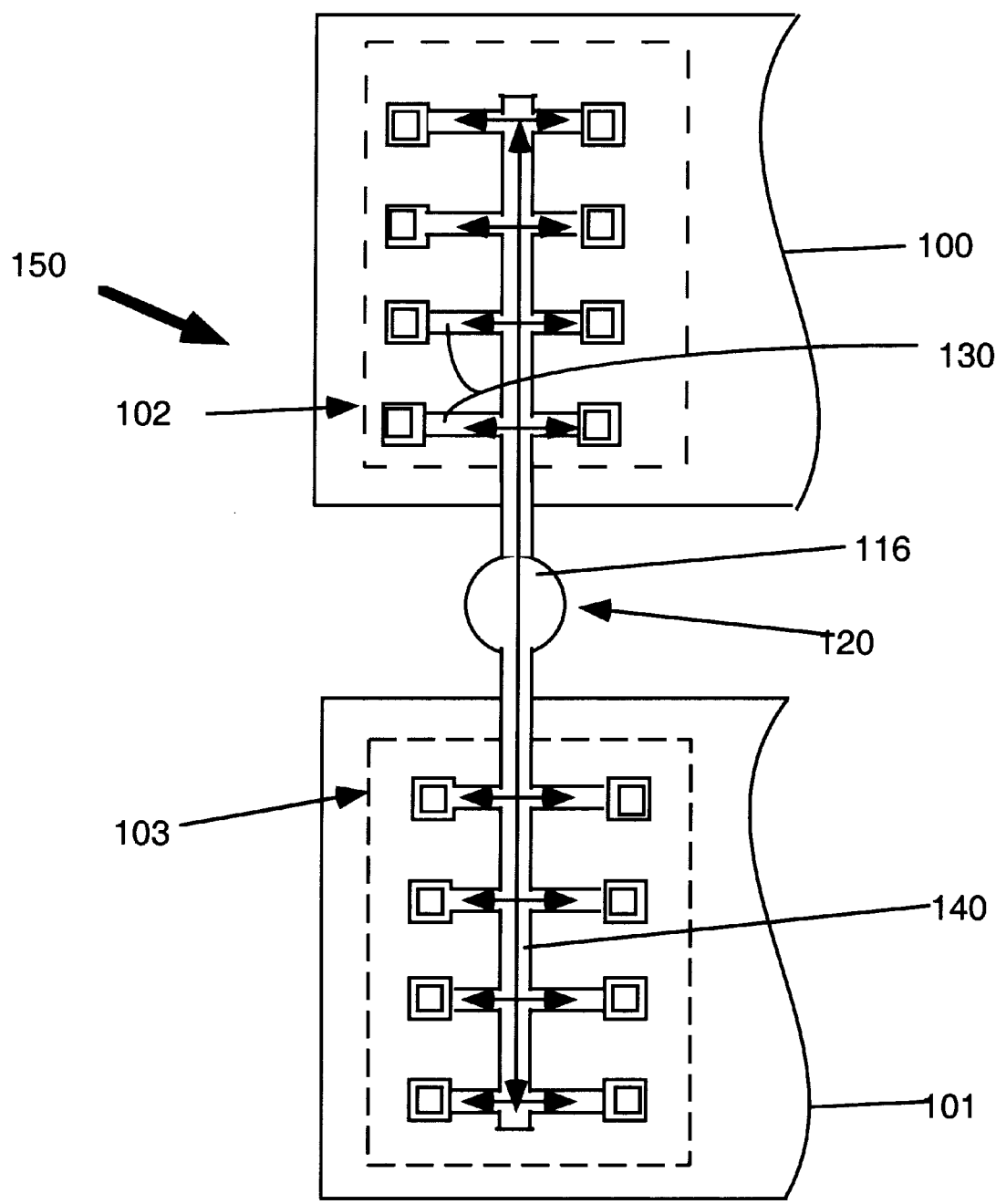
FIG. 1B is an illustration of a prior art molding apparatus for forming a panel of integrated circuits mounted upon a substrate.
Figure 1C:
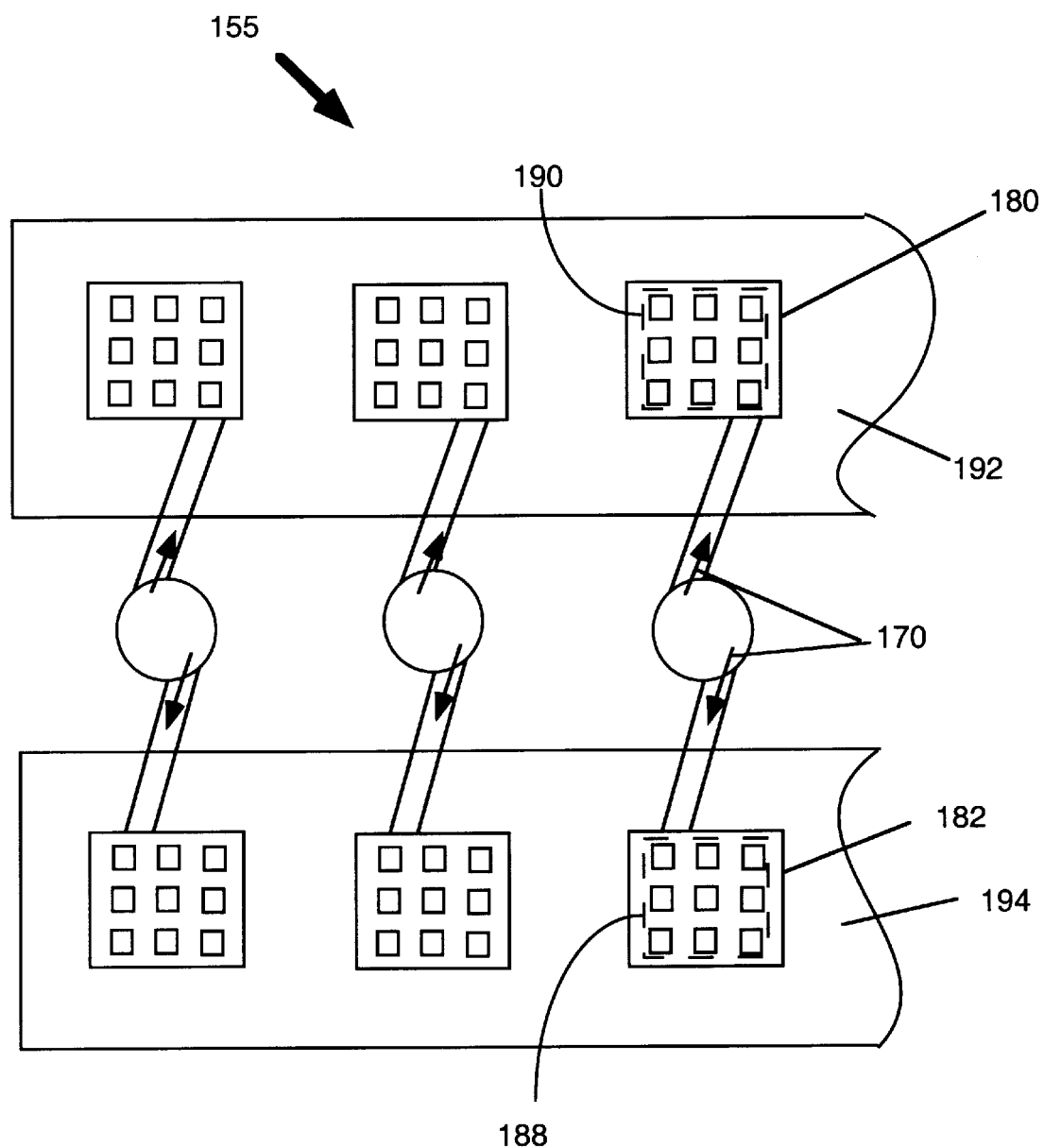
FIG. 1C is an illustration of another molding apparatus for forming a panel of integrated circuits mounted upon a substrate wherein a plurality of integrated circuits are encapsulated together.
Figure 2:
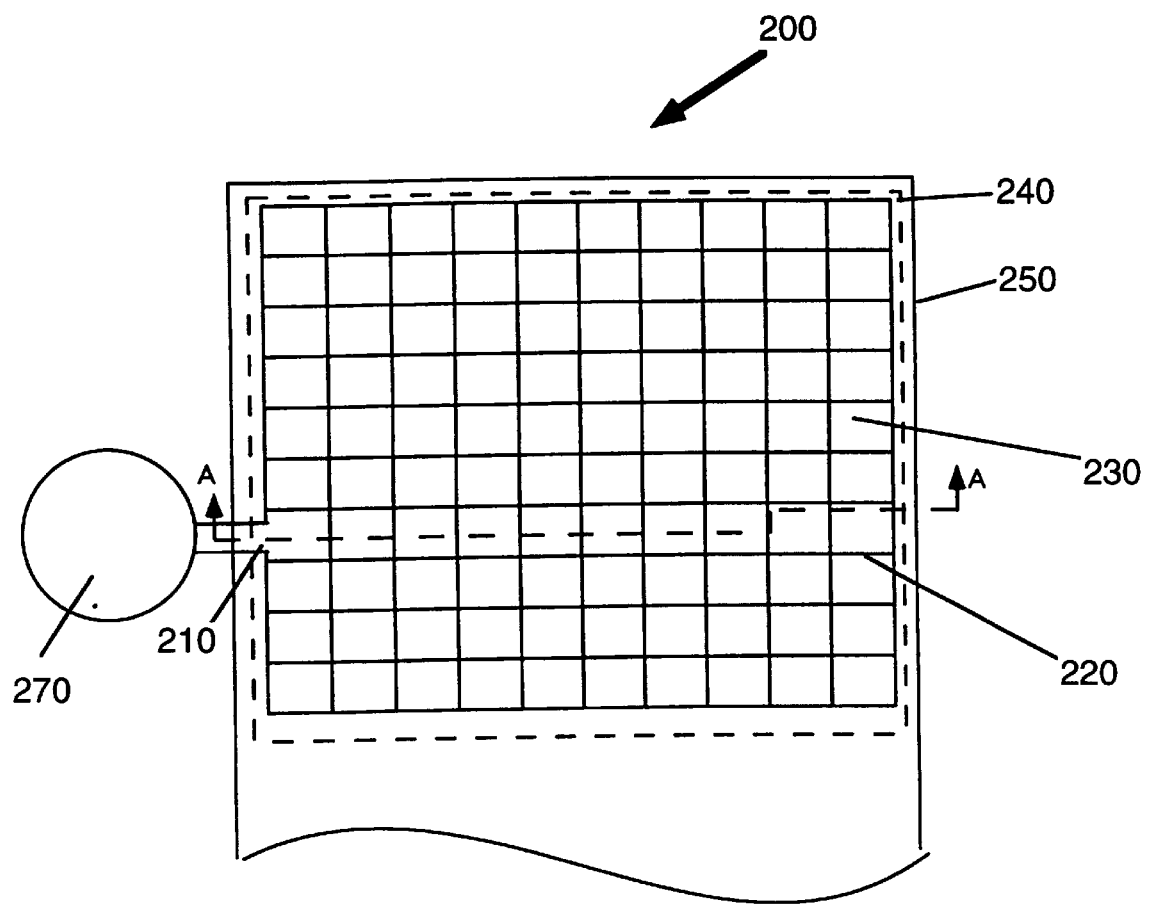
FIG. 2 is a diagrammatic bottom view of a mold in accordance with one embodiment of the present invention.
Figure 3:
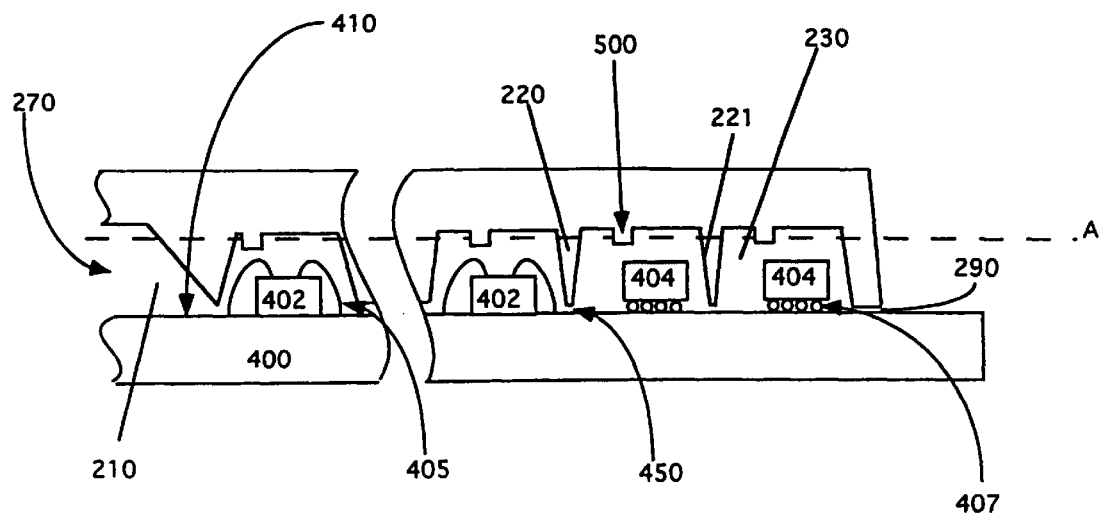
FIG. 3 is a diagrammatic cross sectional view taken along line A—A of the mold illustrated in FIG. 2 positioned over a substrate to facilitate molding.

Referring initially to FIGS. 2 and 3, a mold in accordance with one embodiment of the invention will be described. FIG. 2 is a diagrammatic bottom view of a portion of a mold 200 used to encapsulate a multiplicity of integrated circuits mounted on a substrate panel. FIG. 3 is a cross sectional side view of the mold 200 positioned over a substrate 400 during a molding operation. The substrate 400 may be formed from a material selected from the group consisting of bismalimide triagine, PCB, FR4, or FR5. The mold 200 includes a mold body 250 supporting a mold gate 210 flowably connecting a gang pot 270 to a molding cavity 240. The molding cavity 240 includes an array of distinct package recesses 230 formed by a matrix of ridges 220 which form the walls of the recesses. Each package recess 230 is designed to encapsulate an associated integrated circuit 402. It should be noted that the plurality of integrated circuits 402 may be electrically coupled to the substrate in a variety of methods. Two such methods are illustrated in FIG. 3 in which bond pads on die 402 are electrically coupled to interconnections on substrate 400 by way of bond wires 405 and bond pads on die 404 are electrically coupled to interconnects on substrate 400 by way of a ball grid array 407 otherwise referred to as BGA, TAB, or flip chip.

As best seen in FIG. 3, the ridges 220 generally do not extend the entire depth of the molding cavity. Thus, relatively small gaps are formed between the ridges 220 and a surface 410 of substrate 400 during an encapsulation operation. These gaps form flowgates 450 between adjacent package recesses 230 which permit encapsulating material and gases contained within each recess to pass through during molding operations. In another embodiment, mold cavity 240 may be designed without the presence of any ridges. In this manner, multi-dies may be encapsulated to form, for example, multi-chip packages.

The size, shape and spacing of the packages formed by the mold 200 are defined primarily by the shapes and spacings of the ridges 220. The ridges 220 may be variably sized to accommodate different package types and configurations. In the embodiment shown, the walls 221 of the ridges 220 are tapered relative to the surface 410 to facilitate the venting of any gases during the molding operation and to help reduce the adhesion of molding compound to the ridge walls. The actual taper angle Ø may be widely varied depending on the needs of a particular system. By way of example, taper angles in the range of approximately 15 to 30 degrees work well. In the embodiment shown, the ridges 220 are of uniform height such that flowgates 450 are formed between all adjacent package recesses. However, in alternative embodiments, the ridges may be of different heights in order to control or eliminate the flow of encapsulating material between adjacent package recesses.

Figure 4A:
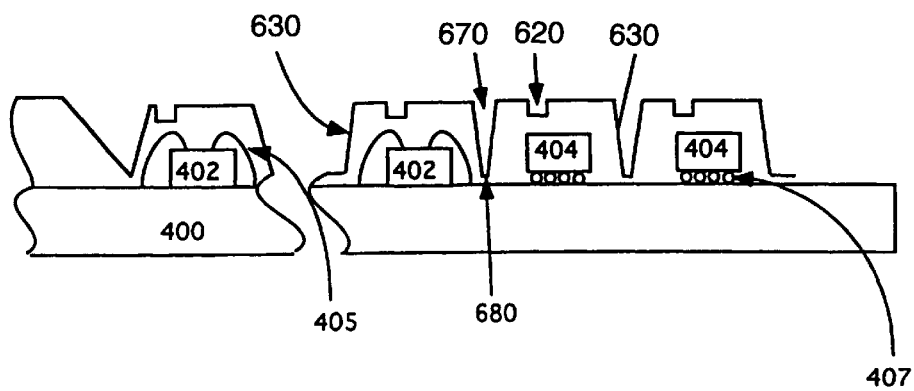
FIG. 4A is a diagrammatic cross sectional view taken along line A—A of a panel of packaged integrated circuits formed in accordance with an embodiment of the present invention.

As can best be seen with reference to FIG. 4A, the mold 200 creates an encapsulated panel of packaged integrated circuits 402. The walls 221 of the ridges 220 form grooves 670 in the encapsulating material between adjacent packages 630. Interstitial landings 680 that are substantially thinner than the molding compound covering each integrated circuits are formed between adjacent packages 630 in each of the flowgate locations. The grooves 670 may provide alignment markings for subsequent singulation of the packaged integrated circuits. In addition, grooves 670 may help prevent substrate warpage caused by the setting of the molding compound by providing stress relief. The interstitial landings 680 being regions of reduced molding compound thickness are more flexible then the thicker portions of the molding compound covering each integrated circuit. It should be noted that the plurality of integrated circuits 402 may be electrically coupled to the substrate in a variety of methods. Two such methods are illustrated in FIG. 4A in which bond pads on die 402 may be electrically coupled to interconnects on substrate 400 by way of bond wires 405 and bond pads on die 404 may be electrically coupled to interconnects on substrate 400 by way of a ball grid array 407 otherwise referred to as BGA, TAB, or flip chip.

Figure 4B:
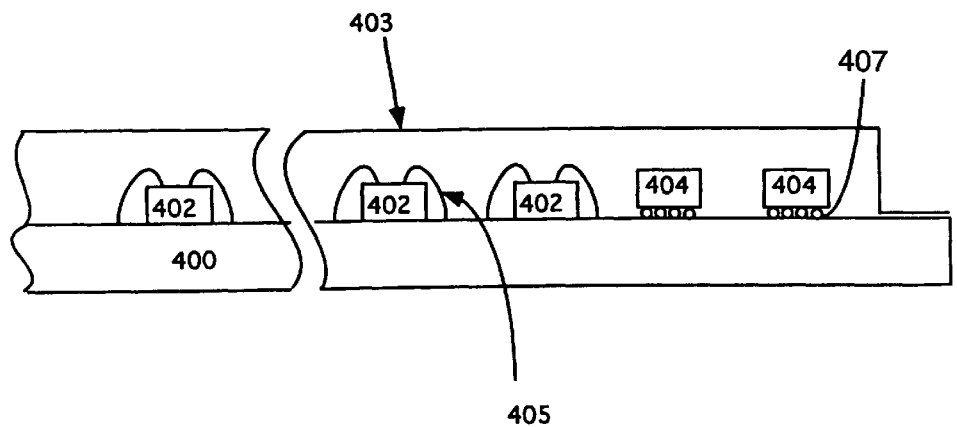
FIG. 4B is a diagrammatic cross sectional view taken along line A—A of a panel of packaged integrated circuits formed in accordance with another embodiment of the present invention.

In another embodiment illustrated in FIG. 4B, the mold 200 may create an encapsulated panel of packaged integrated circuits 403 substantially without grooves or other surface features suitable, for example, in forming multi-chip packages. Panel 403 may also be singulated by any means known to those skilled in the art of semiconductor package manufacture. As discussed above, bond pads on die 402 may be electrically coupled to interconnects on substrate 400 by way of bond wires 405 and bond pads on die 404 may be electrically coupled to interconnects on substrate 400 by way of a ball grid array 407 otherwise referred to as a BGA, TAB, or flip chip.

As will be appreciated by those skilled in the art, it is often extremely useful to provide some sort of mark on a package to facilitate orientation. By way of example, it is common to provide an indent or nub adjacent pin one of the package such that pin one may be readily identified. Such a marking can be readily accommodated in the described mold by simply providing a suitable marking structure 500 in each package recess as illustrated in FIG. 3. The size, shape and locations of the marks may be widely varied to meet the needs of a particular package. In the embodiment shown, the marking structure 500 takes the form of a small nub formed in the top surface of each package recess at a position that identifies the location of pin one. The encapsulated package then includes a corresponding indent 620 as best seen in FIG. 4A. In the embodiment shown, the indent 620 is a pin one marker.

In another embodiments, marking structure 500 may form an identifier which provides part number identification permanently encoded in the surface of the packaged integrated circuit. Permanent package marking (such as numbers) may be useful for tracking and preventing unintentional as well as intentional mis-marking of the packaged integrated circuit.

Figure 5:
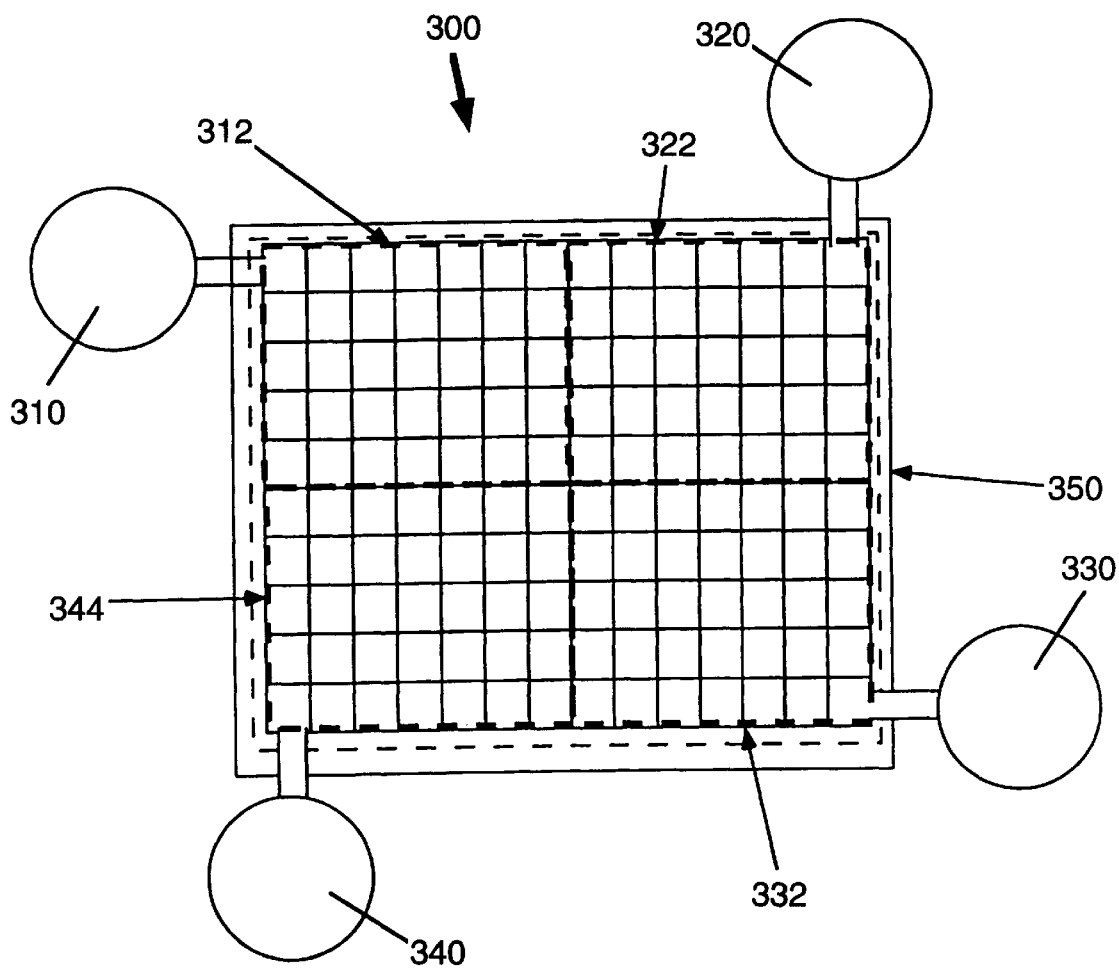
FIG. 5 is a diagrammatic bottom view of a mold having a plurality of gang pots in accordance with another embodiment of the present invention.

Referring next to FIG. 5, in another embodiment, a mold 300 used to form a panel of packaged integrated circuits may include a plurality of gang pots 310 each flowably connected to the multiplicity of package recesses. Each of the plurality of gang pots 300 being suitable for passing molding compound into an associated portion of the multiplicity of package recesses such as 312, 322, 332, and 344. In this manner, the use of the plurality of gang pots 310 to pass molding compound may decrease the time required to fill substantially all recesses included within molding cavity 340.

Additionally, a molding operation using mold 300 may require lower operational gang pot pressure compared to the operational gang pot pressure required by the use of a single gang pot configuration. During a molding operation, the gang pot pressure must be sufficient to overcome the accumulated pressure gradients created by, for example, the muliplicity of flowgates (not shown) for which it provides molding compound. Since each of the plurality of gang pots of mold 300 must supply correspondingly fewer recesses than the singular gang pot configuration, the necessary gang pot pressure for each of the pots of mold 300 is correspondingly reduced by comparison.

In order to form a panel of packaged integrated circuits according to one embodiment of the invention, reference is made to FIGS. 2–4. A source of molding compound sufficient to fill substantially all the package recesses 230 within molding cavity 240 is supplied to gang pot 270. The molding compound contained within or supplied to gang pot 270 is then fed to the multiplicity of package recesses 230 by way of the mold gate 210. The molding compound spreads fan-like throughout the molding cavity 240 from the mold gate 210 by way of the flowably interconnecting flow gates 450 to fill substantially all the recesses included within molding cavity 240. Any gases contained within molding cavity 240 prior to the molding operation will be swept out of the molding cavity 240 by way of suitably located gas vents 290 by the advancing molding compound.

Referring to FIG. 3, the molding compound flows in a substantially continuous fashion into each of the multiplicity of package recesses 230 by way of one of its associated flowgates 450 until integrated circuit 402 has been substantially covered. It should be noted, the inclined surface 221 afforded by taper angle 0, allows the advancing molding compound to force any gases contained within package recess 230 through adjoining flowgates 450. The gases are eventually vented to an exterior region by way of suitably located gas vent 290. The width of flowgate 450 may be varied to accommodate a variety of molding compounds or package designs.

Figure 6:
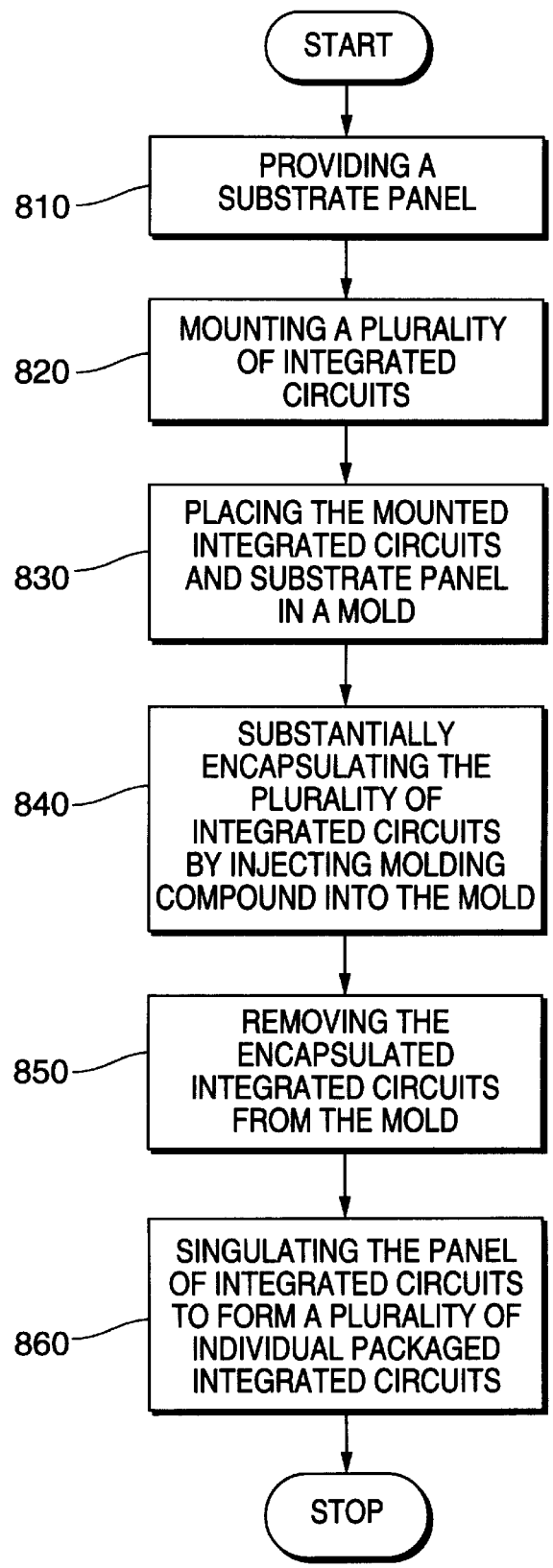
FIG. 6 is a flowchart of the method of producing a plurality of packaged integrated circuits from a panel of integrated circuits in accordance with an aspect of the invention.

FIG. 6 is a flowchart detailing the process 800 of forming a panel of packaged integrated circuits in accordance with an embodiment of the invention. In the described embodiment, a substrate panel having a plurality of traces thereon is provided in step 810. A plurality of integrated circuits are then mounted on the substrate panel and electrically coupled to associated substrate traces by any suitable technique in step 820. By way of example, wire bonding, tape automated bonding or flip chip type bonding would all work well. After the integrated circuits have been mounting on and electrically coupled to the substrate, the process flows to step 830 where the populated panel is placed in a mold having a multiplicity of package recesses as described above. After emplacement within the mold, substantially all of the plurality of integrated circuits included within the integrated panel are encapsulated by the introduction of molding compound into the mold during step 840. The molding compound substantially fills each of the recesses included within the molding cavity thereby covering each of the integrated circuits contained therein.

In the described embodiment, the molding compound substantially takes the shape of the interior cavity of the package recess. In this manner, any required surface markings such as pin one dimples or other useful indentations or forms within the shape of the molded encapsulant may be formed as desired. Once the molding compound has substantially filled as many of the multiplicity of package recesses as desired, the molding compound flow is halted and the molding compound is allowed to set to form a plurality of packaged integrated circuits from the plurality of integrated circuits. At this time the mold may be removed during step 850 and each of the plurality of packaged integrated circuits may be singulated during step 860. The singulation step may involve a cutting operation whereby the a cutting device such as a saw may be used to separate each of the encapsulated integrated circuits. In another embodiment, the integrated circuits may be singulated by a breaking operation whereby the integrated circuits are singulated by breaking the substrate panel and associated layer of molding compound along the grooves formed by the plurality of ridges.

Although, several embodiments of the present invention have been described in detail, it should be understood that the present invention may be embodied in many other specific forms without departing from the spirit or scope of the invention. Particularly, shape and form of the package recesses may be any deemed appropriate and suitable for the application desired. Further, the present invention is not limited to single package or mold configurations. Rather, the package and mold configuration detailed above are used as an example to illustrate the simplicity of the method and apparatus for forming a panel of packaged integrated circuits according to the present invention and its advantages over conventional methods of forming same.

Also, future developments such as laser etching technology or improved techniques in package molding compound technology can be readily incorporated in the advantages of the present invention. The invention has been primarily described in the context of packages that contain a single die. However, the described technique is equally applicable to packaging multi-chip modules, hybrid packages and others having a plurality of components within each package recess. Therefore, the present examples are to be considered as illustrative and not restrictive, and the invention is not to be limited to the details given, herein, but may be modified with the scope of the appended claims.

What is claimed is:

1. A method of forming a panel of packaged integrated circuits, comprising:

providing a substrate panel having a plurality of electrically conductive interconnects;

attaching a multiplicity of integrated circuits to the substrate panel;

placing the substrate panel in a mold having a molding chamber with a two dimensional array of immediately adjacent package recesses flowably interconnected by way of a plurality of molding compound flowgates, each package recess being suitable for receiving an associated one of the integrated circuits; and passing molding compound into the molding chamber by way of a mold gate, wherein at least some of the molding compound passes through a plurality of different package recesses by way of associated flowgates, thereby substantially encapsulating the plurality of integrated circuits within the molding chamber by substantially filling their associated package recesses, and wherein most of the package recesses directly receive molding compound from at least two immediately adjacent package recesses.

2. A method as recited in claim 1 wherein each of the integrated circuits has a plurality of bond pads, the method further comprising the step of electrically connecting the bond pads of each integrated circuit to associated ones of the electrically conductive interconnects.

3. A method as recited in claim 1 wherein each package recess is suitable for receiving a plurality of associated integrated circuits, wherein the packaged integrated circuits are multichip modules.

4. A method as recited in claim 1 wherein the mold includes a gas vent suitable for releasing gas during the passing of molding compound into the molding chamber.

5. A method as recited in claim 1 wherein the package recesses are shaped to substantially prevent entrapment of gas during the passing of molding compound into he molding chamber.

6. A method as recited in claim 1 wherein the package recesses are shaped to substantially prevent adhesion of molding compound subsequent to the injecting.

7. A method as recited in claim 1 wherein the mold further includes a matrix of intersecting ridges positioned to define the multiplicity of adjacent package recesses and form the flowgates.

8. A method as recited in claim 7 wherein the matrix of ridges displace sufficient molding compound to form a plurality of grooves in a surface of the panel of integrated circuits.

9. A method as recited in claim 8 wherein the panel of integrated circuits are singulated by sawing the panel of integrated circuits.

10. A method as recited in claim 1 wherein the package recesses are shaped suitably for forming identification marks in the molding compound of each of the plurality of the encapsulated integrated circuits.

11. A method as recited in claim 7 wherein the molding compound is plastic.

12. A method as recited in claim 1 wherein the integrated circuit package is a chip scale package.

13. A method as recited in claim 1 wherein the substrate is formed from a material selected from the group consisting of bismalimide triagine, FR4, and FR5.

14. A method as recited in claim 2, the method further comprising the step of electrically connecting the bond pads of each integrated circuit to associated ones of the electrically conductive interconnects by way of wire bonds, TAB, and flip chip.

15. A method of forming a packaged integrated circuit, comprising:

forming a panel of packaged integrated circuits as recited in claim 1; and singulating the plurality of integrated circuits.

16. A method as recited in claim 15 wherein the integrated circuits are singulated by sawing the panel of integrated circuits along grooves, the grooves being formed during the passing of molding compound by ridges in the molding chamber.

17. A method as recited in claim 15 wherein the singulating includes:

partially sawing through a first surface of the substrate to form a matrix of cuts aligned with a matrix of grooves, the grooves being formed during the passing of molding compound by ridges in the molding chamber; and breaking the substrate along the cuts to form individual integrated circuit packages.

18. A method of forming a panel of packaged integrated circuits that are attached to a substrate panel having a plurality of electrically conductive interconnects, comprising:

placing the substrate panel in a mold having a molding chamber with a two dimensional array of immediately adjacent package recesses flowably interconnected by way of a plurality of molding compound flowgates, each package recess being suitable for receiving an associated one of the integrated circuits; and passing molding compound into the molding chamber by way of a mold gate, wherein at least some of the molding compound passes through a plurality of different package recesses by way of associated flowgates, thereby substantially encapsulating the plurality of integrated circuits within the molding chamber by substantially filling their associated package recesses, and wherein most of the package recesses receive molding compound from at least two adjacent package recesses.

19. A method as recited in claim 18, wherein the recesses are arranged as a waffle pack.

20. A method as recited in claim 18 wherein the package recesses are shaped to substantially prevent entrapment of gas during the passing of molding compound into the molding chamber.

21. A method as recited in claim 18 wherein the mold further includes a matrix of intersecting ridges positioned to define the multiplicity of adjacent package recesses and form the flowgates.

* * * * *